US012368059B2

(12) United States Patent
Uozumi et al.

(10) Patent No.: US 12,368,059 B2
(45) Date of Patent: Jul. 22, 2025

(54) SUBSTRATE CLEANING APPARATUS, SUBSTRATE PROCESSING APPARATUS, SUBSTRATE CLEANING METHOD, DEVICE MANUFACTURING METHOD, AND NON-TRANSITORY COMPUTER READABLE MEDIUM

(71) Applicant: EBARA CORPORATION, Tokyo (JP)

(72) Inventors: Shuji Uozumi, Tokyo (JP); Kenichi Suzuki, Tokyo (JP)

(73) Assignee: EBARA CORPORATION, Tokyo (JP)

(*) Notice: Subject to any disclaimer, the term of this patent is extended or adjusted under 35 U.S.C. 154(b) by 903 days.

(21) Appl. No.: 17/403,881

(22) Filed: Aug. 17, 2021

(65) Prior Publication Data

US 2022/0068669 A1 Mar. 3, 2022

(30) Foreign Application Priority Data

Aug. 25, 2020 (JP) ................................. 2020-142163

(51) Int. Cl.
*H01L 21/67* (2006.01)
*H01L 21/321* (2006.01)
(Continued)

(52) U.S. Cl.
CPC .... *H01L 21/67046* (2013.01); *H01L 21/3212* (2013.01); *H01L 21/67253* (2013.01); *H01L 21/67706* (2013.01); *H01L 21/68764* (2013.01)

(58) Field of Classification Search
CPC ........... H01L 21/67046; H01L 21/3212; H01L 21/67253; H01L 21/67706; H01L 21/68764; H01L 21/67051; B08B 1/32; B08B 3/04; B08B 1/50; B08B 1/52; B08B 1/14; B08B 1/00; B08B 1/40;
(Continued)

(56) References Cited

U.S. PATENT DOCUMENTS 2,739,429 A * 3/1956 Peterson ................. B24B 57/00
451/60
3,129,960 A * 4/1964 Schrodt ................... F16D 25/12
192/85.33
(Continued)

FOREIGN PATENT DOCUMENTS

EP 2808097 A1 * 12/2014 ............... B08B 3/08
JP 2000301079 10/2000
JP 2020096087 6/2020

*Primary Examiner* — David G Cormier
*Assistant Examiner* — Thomas Bucci
(74) *Attorney, Agent, or Firm* — JCIPRNET

(57) ABSTRACT

Provided is a technique that can optimize a flow volume of a first liquid supplied into a cleaning member. A substrate cleaning apparatus includes: a holding portion having a bearing portion that rotatably holds a cleaning member for cleaning a substrate; a first supply portion that is at least partially arranged inside the holding portion and supplies the first liquid into the cleaning member through the inside of the holding portion; and a second supply portion that supplies a second liquid to the bearing portion. The holding portion is equipped with a discharge portion that has a discharge port for discharging the liquid accumulated inside the holding portion. The discharge portion is equipped with a flow meter that measures a flow volume of the liquid discharged from the discharge port.

15 Claims, 5 Drawing Sheets

(51) Int. Cl.
  *H01L 21/677* (2006.01)
  *H01L 21/687* (2006.01)

(58) Field of Classification Search
  CPC .............. F16C 33/1085; F16C 33/6622; F16C 33/6625; F16N 7/40
  USPC ........................................................ 134/137
  See application file for complete search history.

(56) References Cited

U.S. PATENT DOCUMENTS

| | | | | |
|---|---|---|---|---|
| 3,679,277 | A * | 7/1972 | Dohmen | F16C 33/76 310/90 |
| 3,692,373 | A * | 9/1972 | Nichols | F16J 15/406 384/131 |
| 4,018,304 | A * | 4/1977 | Lolachi | B04B 9/12 494/83 |
| 5,658,053 | A * | 8/1997 | Vencill | B60B 27/02 301/105.1 |
| 6,248,009 | B1 * | 6/2001 | Ito | B24B 37/345 451/443 |
| 6,416,227 | B1 * | 7/2002 | Ohrndorf | B21B 31/076 384/414 |
| 6,427,566 | B1 * | 8/2002 | Jones | H01L 21/67046 82/151 |
| 6,712,080 | B1 * | 3/2004 | Handschuh | F01D 25/20 134/99.1 |
| 6,728,989 | B2 * | 5/2004 | Lerner | B08B 1/32 277/423 |
| 2002/0007840 | A1 * | 1/2002 | Atoh | B08B 1/36 134/33 |
| 2002/0100131 | A1 * | 8/2002 | Lerner | B08B 1/34 15/77 |
| 2005/0087212 | A1 * | 4/2005 | Yudovsky | B08B 1/32 134/6 |
| 2011/0297484 | A1 * | 12/2011 | Williams, Jr. | F16N 7/22 184/26 |
| 2013/0000671 | A1 * | 1/2013 | Wang | B08B 1/32 134/6 |
| 2013/0068253 | A1 * | 3/2013 | Gonzalez | B08B 3/04 134/21 |
| 2014/0193263 | A1 * | 7/2014 | Pasquet | F16N 29/00 184/26 |
| 2014/0367198 | A1 * | 12/2014 | Williams, Jr. | F16N 7/22 184/6.1 |
| 2017/0236730 | A1 * | 8/2017 | Imamura | H01L 21/67253 134/57 R |
| 2020/0116302 | A1 * | 4/2020 | Glass | F16N 11/00 |
| 2020/0188962 | A1 * | 6/2020 | Uozumi | B08B 3/04 |

* cited by examiner

SUBSTRATE CLEANING APPARATUS, SUBSTRATE PROCESSING APPARATUS, SUBSTRATE CLEANING METHOD, DEVICE MANUFACTURING METHOD, AND NON-TRANSITORY COMPUTER READABLE MEDIUM

CROSS-REFERENCE TO RELATED APPLICATION

This application claims the priority benefit of Japan application serial no. 2020-142163, filed on Aug. 25, 2020. The entirety of the above-mentioned patent application is hereby incorporated by reference herein and made a part of this specification.

BACKGROUND

Technical Field

The disclosure relates to a substrate cleaning apparatus, a substrate processing apparatus, a substrate cleaning method, a device manufacturing method, and a non-transitory computer readable medium having a bearing portion that holds a cleaning member to be rotatable.

Related Art

Chemical mechanical polishing (CMP) is being used in semiconductor device manufacturing lines along with multi-layer wiring due to the high integration and miniaturization of devices. A CMP process is a process of pressing and polishing a wafer while supplying a slurry (polishing liquid) onto a pad of polyurethane foam or the like, and various slurries are used according to the film type of the substrate surface. The CMP is a wet process in which slurry residues and the like are generated in a semiconductor device manufacturing process, and a large amount of particles, metal impurities and the like remain on the substrate after CMP, and thus it is necessary to reduce the contamination caused by these particles, metal impurities and the like to an acceptable level before sending the substrate to the next process.

Therefore, conventionally, developments and proposals have been made to realize a more advanced substrate cleaning technique.

For example, conventionally, there is a technique of receiving a cleaning member such as a roll or the like by a bearing portion and supplying a cleaning liquid to the bearing portion. Patent literature 1 discloses a substrate cleaning apparatus having: a substrate holding portion that rotates and holds a substrate, a cleaning tool that scrubs and cleans a surface to be cleaned of the substrate, and a cleaning tool holding portion that holds the cleaning tool to be rotatable around an axis thereof. In this substrate cleaning apparatus, the cleaning tool has a shaft body, and a cleaning member attached around the shaft body and having cleaning liquid flowability.

Besides, a shaft hole extending in the axial direction and a cleaning liquid injection port penetrating in the radial direction from the shaft hole are formed in the shaft body, and a fluid lubrication bearing with a cleaning liquid as a lubricating fluid is configured at one end between the shaft body and the cleaning tool holding portion.

Meanwhile, with the miniaturization of substrates, improvement of the cleaning performance is recently required. In order to meet these needs, when a part of the cleaning liquid is used for lubricating the bearing as in an aspect disclosed in Patent literature 1, there are technical problems such as making the amount of the cleaning liquid provided to the substrate more quantitative, and suppressing the amount of leakage of the cleaning liquid supplied to the bearing.

The applicant has already proposed that, for a substrate cleaning apparatus in which the amount of liquid provided to the substrate is easily controlled and the adverse effects caused by the liquid supplied to the bearing portion on the substrate are suppressed, an aspect is adopted which has a first supply portion that supplies a first liquid into the cleaning member and a second supply portion that supplies a second liquid to the bearing portion, and the bearing portion is lubricated by the second liquid while the first liquid is supplied at a constant flow volume (see Patent literature 2).

LITERATURE OF RELATED ART

Patent Literature

[Patent literature 1] Japanese Patent Laid-Open No. 2000-301079
[Patent literature 2] Japanese Patent Laid-Open No. 2020-096087

SUMMARY

The inventors have conducted diligent studies in order to find an improved technique of the aspect having the first supply portion that supplies the first liquid into the cleaning member and the second supply portion that supplies the second liquid to the bearing portion. As a result, the following findings are obtained. It should be noted that the following findings are merely the triggers for the disclosure and do not limit the disclosure.

That is, in the above aspect, the flow volume of the first liquid supplied into the cleaning member is made constant by closed loop control (CLC) in which a flow meter and a needle valve are used on a supply side.

However, it has been found by the studies of the inventors that, depending on individual differences, changes over time, and the like in the drainage performance of the cleaning member, the first liquid supplied at a constant flow volume is not all discharged through the cleaning member, but flows from the bearing portion onto a drain side of the holding portion and is drained. Therefore, it turned out to be difficult in some cases to supply the first liquid into the cleaning member at a constant flow volume at all times.

Thus, in order to obtain a more improved technique, it is desired to provide a technique that can optimize the flow volume of the first liquid supplied into the cleaning member. In addition, generally, as the line width size of devices has become smaller in recent years, a need for surface state management on the substrate surface is increasing. For example, there is one problem that, in a substrate after wet cleaning when trenches having a high aspect ratio are present on the substrate surface, stictions caused by the generation of capillary forces during drying after wet processing occur between features formed in a semiconductor device structure formed on the substrate. Therefore, in order to cope with this situation, there is an increasing need for technological sophistication required for the substrate cleaning apparatus, such as a need to control the amount of liquid supplied onto the substrate surface with high precision.

A substrate cleaning apparatus according to a first aspect of the disclosure includes:
- a holding portion having a bearing portion that rotatably holds a cleaning member for cleaning a substrate;
- a first supply portion that is at least partially arranged inside the holding portion and supplies a first liquid into the cleaning member through the inside of the holding portion; and
- a second supply portion that supplies a second liquid to the bearing portion;
- wherein the holding portion is equipped with a discharge portion that has a discharge port for discharging the liquid accumulated inside the holding portion, and
- the discharge portion is equipped with a flow meter that measures a flow volume of the liquid discharged from the discharge port.

According to this aspect, in the aspect having the first supply portion that supplies the first liquid into the cleaning member and the second supply portion that supplies the second liquid to the bearing portion, even if there is a case in which the first liquid supplied at a constant flow volume is not all discharged through the cleaning member, but flows from the bearing portion onto the discharge port side and is drained depending on the individual differences, the changes over time, and the like in the drainage performance of the cleaning member, because the flow meter arranged in the discharge portion measures the flow volume of the liquid discharged from the discharge port, for example, by subtracting a supply flow volume of the second liquid from the flow volume of the drainage measured by the flow meter, the flow volume of the first liquid supplied from the first supply portion that is not discharged through the cleaning member can be calculated, or by subtracting the flow volume of the drainage measured by the flow meter from the sum of a supply flow volume of the first liquid and the supply flow volume of the second liquid, the flow volume of the first liquid actually supplied into the cleaning member can be calculated. Thus, with respect to the flow volume of the first liquid supplied from the first supply portion, the flow volume of the first liquid actually supplied into the cleaning member (the flow volume of the first liquid discharged through the cleaning member) and the flow volume of the first liquid that is not discharged through the cleaning member (a wasted flow volume) are known, and thus it is possible to optimize the flow volume of the first liquid supplied from the first supply portion into the cleaning member according to requests of each user or process, such as a request to supply the first liquid into the cleaning member at a constant flow volume, a request to reduce the wasted flow volume so as to reduce an environmental load, and other requests.

A substrate cleaning apparatus according to a second aspect of the disclosure includes:
- a holding portion having a bearing portion that rotatably holds a cleaning member for cleaning a substrate;
- a first supply portion that is at least partially arranged inside the holding portion and supplies a first liquid into the cleaning member through the inside of the holding portion; and
- a second supply portion that supplies a second liquid to the bearing portion;
- wherein the holding portion is equipped with a discharge port for discharging the liquid from the inside of the holding portion, and
- the substrate cleaning apparatus includes a control portion that controls a supply flow volume of the first liquid based on a drainage amount signal of the drainage discharged from the discharge port.

A substrate cleaning apparatus according to a third aspect of the disclosure is the substrate cleaning apparatus according to the first aspect,
- wherein the first supply portion has a control portion for controlling a supply flow volume of the first liquid, and
- when the flow volume of the drainage measured by the flow meter changes with respect to the supply flow volumes of the first liquid and the second liquid, the control portion controls the supply flow volume of the first liquid based on the amount of this change.

According to this aspect, an control portion controls the supply flow volume of the first liquid in consideration of the flow volume of the drainage measured by the flow meter, and thus the supply flow volume of the first liquid can be controlled more appropriately than in a case where the flow volume of the drainage measured by the flow meter is not considered.

A substrate cleaning apparatus according to a fourth aspect of the disclosure is the substrate cleaning apparatus according to the second aspect,
- wherein the control portion increases the supply flow volume of the first liquid when the flow volume of the drainage increases.

According to this aspect, a fluctuation in the flow volume of the first liquid actually supplied into the cleaning member can be reduced.

A substrate cleaning apparatus according to a fifth aspect of the disclosure is the substrate cleaning apparatus according to the second aspect,
- wherein the control portion reduces the supply flow volume of the first liquid when the flow volume of the drainage increases.

According to this aspect, it is possible to reduce the wasted flow volume and reduce the environmental load.

A substrate cleaning apparatus according to a sixth aspect of the disclosure is the substrate cleaning apparatus according to any one of the third to fifth aspects,
- wherein the control portion estimates the flow volume of the first liquid supplied into the cleaning member by subtracting the flow volume of the drainage from the sum of the supply flow volume of the first liquid and the supply flow volume of the second liquid.

According to this aspect, the flow volume of the first liquid actually supplied into the cleaning member can be estimated.

A substrate cleaning apparatus according to a seventh aspect of the disclosure is the substrate cleaning apparatus according to the sixth aspect,
- wherein the control portion specifies at least one of a timing of self-cleaning of the cleaning member, a timing of replacement of the cleaning member, and a completion timing of break-in based on the estimated flow volume of the first liquid.

A substrate cleaning apparatus according to an eighth aspect of the disclosure is the substrate cleaning apparatus according to any one of the first to seventh aspects,
- wherein the bearing portion has two or more bearing members arranged side by side in the axial direction, and
- the second supply portion supplies the second liquid between the bearing members in the axial direction.

A substrate cleaning apparatus according to a ninth aspect of the disclosure is the substrate cleaning apparatus according to any one of the first to eighth aspects, wherein the second supply portion supplies the second liquid to the bearing portion even when the first supply portion does not supply the first liquid into the cleaning member.

A substrate cleaning apparatus according to a tenth aspect of the disclosure is the substrate cleaning apparatus according to any one of the first to ninth aspects,
  wherein the holding portion has a rotation portion that rotates together with the cleaning member and is equipped with one or more holes for supplying the second liquid to the bearing portion.

A substrate processing apparatus according to an eleventh aspect of the disclosure includes:
  a substrate polishing apparatus that polishes a substrate; and
  a substrate cleaning apparatus that cleans the substrate after polishing;
  wherein the substrate cleaning apparatus includes:
  a holding portion having a bearing portion that rotatably holds a cleaning member for cleaning the substrate;
  a first supply portion that is at least partially arranged inside the holding portion, and supplies a first liquid into the cleaning member through the inside of the holding portion; and
  a second supply portion that supplies a second liquid to the bearing portion;
  the holding portion is equipped with a discharge portion that has a discharge port for discharging the liquid from the inside of the holding portion, and
  the discharge portion is equipped with a flow meter that measures a flow volume of the liquid discharged from the discharge port.

A substrate processing apparatus according to a twelfth aspect of the disclosure includes:
  a substrate polishing apparatus that polishes a substrate; and
  a substrate cleaning apparatus that cleans the substrate after polishing;
  wherein the substrate cleaning apparatus includes:
  a holding portion having a bearing portion that rotatably holds a cleaning member for cleaning the substrate;
  a first supply portion that is at least partially arranged inside the holding portion, and supplies a first liquid into the cleaning member through the inside of the holding portion; and
  a second supply portion that supplies a second liquid to the bearing portion;
  the holding portion is equipped with a discharge portion that has a discharge port for discharging the liquid from the inside of the holding portion, and
  the substrate cleaning apparatus includes a control portion that controls a supply flow volume of the first liquid based on a drainage amount signal of the drainage discharged from the discharge port.

A method according to a thirteenth aspect of the disclosure is a substrate cleaning method of controlling a supply flow volume of a first liquid from a first supply portion in a substrate cleaning apparatus,
  wherein the substrate cleaning apparatus includes:
  a holding portion having a bearing portion that rotatably holds a cleaning member for cleaning a substrate;
  a first supply portion that is at least partially arranged inside the holding portion, and supplies the first liquid into the cleaning member through the inside of the holding portion; and
  a second supply portion that supplies a second liquid to the bearing portion;
  the holding portion is equipped with a discharge portion that has a discharge port for discharging the liquid accumulated inside the holding portion, and
  the discharge portion is equipped with a flow meter that measures a flow volume of the liquid discharged from the discharge port; and
  the substrate cleaning method includes:
  a step in which the flow volume of the drainage measured by the flow meter is acquired; and
  a step in which when the flow volume of the drainage measured by the flow meter changes with respect to the supply flow volumes of the first liquid and the second liquid, the supply flow volume of the first liquid is controlled based on the amount of this change.

A method according to a fourteenth aspect of the disclosure is a substrate cleaning method of continuously cleaning a plurality of substrates which includes:
  a step in which a cleaning member is rotatably held by a bearing portion; and
  a step in which processing for bringing the cleaning member into contact with the substrate while rotating the cleaning member to clean the substrate is performed on the plurality of substrates;
  wherein the substrate cleaning method includes the following steps (1) to (4):
  (1) a holding portion having the bearing portion is equipped with a first supply portion that supplies a first liquid to the inside of the holding portion, and a discharge portion that has a connection port connected to a flow path in the cleaning member to introduce the first liquid into the cleaning member and a discharge port for discharging the liquid accumulated inside, and the first liquid is supplied into the cleaning member from the first supply portion through the connection port inside the holding portion;
  (2) a second liquid for cooling and lubricating the bearing portion is supplied from the second supply portion to the bearing portion;
  (3) the flow volume of the drainage discharged from the discharge port is measured by a flow meter arranged in the discharge portion; and
  (4) when the flow volume of the drainage measured by the flow meter exceeds a predetermined threshold value, a control signal for changing a supply flow volume of the first liquid from the first supply portion is generated in a manner that the flow volume of the drainage becomes equal to or less than the predetermined threshold value.

A method according to a fifteenth aspect of the disclosure is a device manufacturing method which includes
  a step of cleaning a substrate by the substrate cleaning method according to the thirteenth or fourteenth aspect,
  wherein the substrate prepared for executing the step of cleaning the substrate is a substrate in which a liquid is previously attached to the surface before the start of processing.

A non-transitory computer readable medium according to a sixteenth aspect of the disclosure is a non-transitory computer readable medium storing a program comprising a set of instructions, which is configured to cause an apparatus to perform the substrate cleaning method according to any one of the thirteenth aspect to the fifteenth aspect of the disclosure when executed on the apparatus.

DESCRIPTION OF THE EMBODIMENTS

Figure 1A:
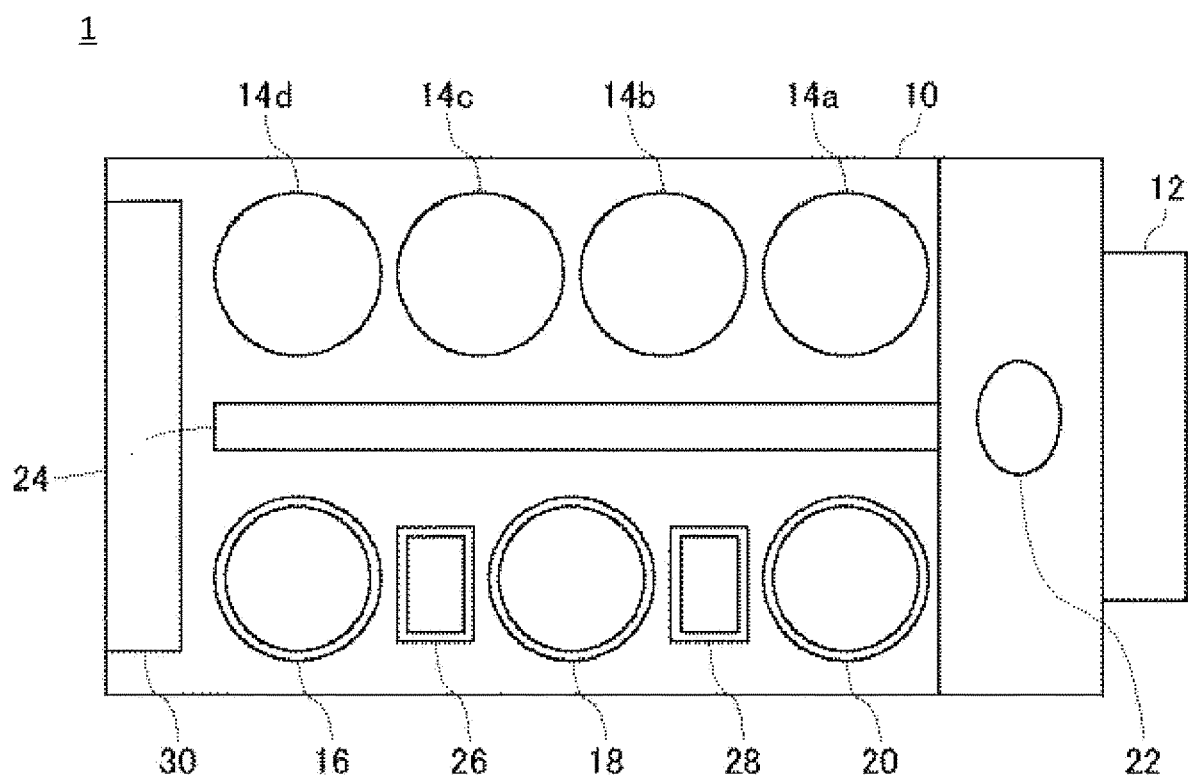
FIG. 1A is a plan view showing an overall configuration of a substrate processing apparatus including a substrate cleaning apparatus according to one embodiment.

Hereinafter, embodiments of the disclosure are described in detail with reference to the accompanying figures. Note that, in the following description and the figures used in the following description, the same reference numerals are used for portions that can be configured in the same manner, and duplicate description is omitted. In addition, unless otherwise specified in the specification, the expressions "above" and "below" mean including a case in which two constituent elements are separated from each other in addition to a case in which two constituent elements are in contact with each other. Furthermore, the expressions "including", "having", "equipped with" or "comprising" a constituent element do not mean excluding the existence of other constituent elements.

FIG. 1A is a plan view showing an overall configuration of a substrate processing apparatus 1 equipped with a substrate cleaning apparatus according to one embodiment.

As shown in FIG. 1A, the substrate processing apparatus 1 includes a housing 10 which is substantially rectangular and a load port 12 on which a substrate cassette (not shown) for stocking a plurality of substrates W is placed. The load port 12 is arranged adjacent to the housing 10. On the load port 12, an open cassette, a standard manufacturing interface (SMIF) pod, or a front opening unified pod (FOUP) can be mounted. The SMIF pod and the FOUP are airtight containers capable of maintaining an environment independent of an external space by accommodating the substrate cassette inside and covering the same with a partition wall. The substrate W may be, for example, a semiconductor wafer or the like. However, a substrate to be processed is not limited to the semiconductor wafer, and may be another type of substrate used for manufacturing a semiconductor apparatus, such as a glass substrate, a ceramic substrate, or the like.

Inside the housing 10, a plurality of (four in the aspect shown in FIG. 1A) polishing units (substrate polishing apparatuses) 14a to 14d for polishing the substrate W, a first cleaning unit 16 and a second cleaning unit 18 for cleaning the substrate W after polishing, and a drying unit 20 for drying the substrate W after cleaning are accommodated. The polishing units 14a to 14d are aligned along the longitudinal direction of the housing 10, and the cleaning units 16 and 18 and the drying unit 20 are also aligned along the longitudinal direction of the housing 10. In addition, in the embodiment, the substrate W in which no trench is present on the substrate surface is targeted. Furthermore, according to a configuration described later, the substrate W, in a state where the surface is wet after chemical mechanical polishing which is wet processing, is directly transported to the first cleaning unit 16 without the surface being dried, the substrate W cleaned by the first cleaning unit 16 is directly transported to the second cleaning unit 18 without being dried, the substrate W cleaned by the second cleaning unit 18 is directly transported to the drying unit 20 without being dried, and the substrate W is dried for the first time in the drying unit 20.

A first transport robot 22 is arranged in a region that is surrounded by the load port 12, the polishing unit 14a located on the load port 12 side, and the drying unit 20. In addition, a transport unit 24 is arranged parallel to the longitudinal direction of the housing 10 between a region in which the polishing units 14a to 14d are aligned and a region in which the cleaning units 16 and 18 and the drying unit 20 are aligned. The first transport robot 22 receives the substrate W before polishing from the load port 12 and delivers the same to the transport unit 24, or receives, from the transport unit 24, the dried substrate W removed from the drying unit 20.

Between the first cleaning unit 16 and the second cleaning unit 18, a second transport robot 26 that delivers the substrate W between the first cleaning unit 16 and the second cleaning unit 18 is arranged. In addition, between the second cleaning unit 18 and the drying unit 20, a third transport robot 28 that delivers the substrate W between the second cleaning unit 18 and the drying unit 20 is arranged.

Furthermore, the substrate processing apparatus 1 is equipped with a control apparatus 30 that controls the movement of each of the devices 14a to 14d, 16, 18, 20, 22, 24, 26, and 28. As the control apparatus 30, for example, a programmable logic controller (PLC) is used. In the aspect shown in FIG. 1, the control apparatus 30 is arranged inside the housing 10, but the disclosure is not limited hereto, and the control apparatus 30 may be arranged outside the housing 10.

In the example shown in FIG. 1A, as the first cleaning unit 16, a roll cleaning apparatus is used in which a roll cleaning member extending horizontally is brought into contact with the surface of the substrate W in the presence of a cleaning liquid, and the surface of the substrate W is scrubbed and cleaned while the roll cleaning member is rotated on its own axis. As the second cleaning unit 18, a pencil cleaning apparatus is used in which a columnar pencil cleaning member extending vertically is brought into contact with the surface of the substrate W in the presence of a cleaning liquid, and the pencil cleaning member is rotated on its own axis and moved toward one direction parallel to the surface of the substrate W to scrub and clean the surface of the substrate W. In addition, as the drying unit 20, a spin drying apparatus is used which ejects isopropyl alcohol (IPA) vapor from an injection nozzle that moves in one direction parallel to the surface of the substrate W toward the rotating substrate W to dry the substrate W, and further rotates the substrate W at a high speed to dry the substrate W by a centrifugal force.

Note that, in the example, the roll cleaning apparatus is used as the first cleaning unit 16, but the same pencil cleaning apparatus as the second cleaning unit 18 may be used as the first cleaning unit 16, a buff polishing and cleaning apparatus may be used in which a buff cleaning and polishing member having a rotation axis extending vertically is brought into contact with the surface of the substrate W in the presence of a cleaning liquid, and the buff cleaning and polishing member is rotated on its own axis and moved toward one direction parallel to the surface of the substrate W to scrub, clean and polish the surface of the substrate W, or a two-fluid jet cleaning apparatus that cleans the surface of the substrate W by a two-fluid jet may be used. In addition, in the example, the pencil cleaning apparatus is used as the second cleaning unit 18, but the same roll cleaning apparatus as the first cleaning unit 16 may be used as the second cleaning unit 18, a buff polishing and cleaning apparatus may be used, or a two-fluid jet cleaning apparatus may be used.

The cleaning liquid includes rinse agents such as deionized water (DIW) and the like, and chemicals such as an ammonia hydrogen peroxide solution mixture (SC1), a hydrochloric acid hydrogen peroxide solution mixture (SC2), a sulfuric acid hydrogen peroxide (SPM), a hydrolyzed sulfuric acid, a hydrofluoric acid and the like. Unless otherwise specified in the embodiment, the cleaning liquid refers to either a rinse agent or a chemical.

Next, a substrate cleaning apparatus 40 according to one embodiment is described with reference to FIGS. 1B, 2 and 3. The substrate cleaning apparatus 40 according to one embodiment can be applied to both the first cleaning unit 16 and the second cleaning unit 18, and can be applied to the roll cleaning apparatus, the pencil cleaning apparatus, and the buff polishing and cleaning apparatus.

Figure 1B:
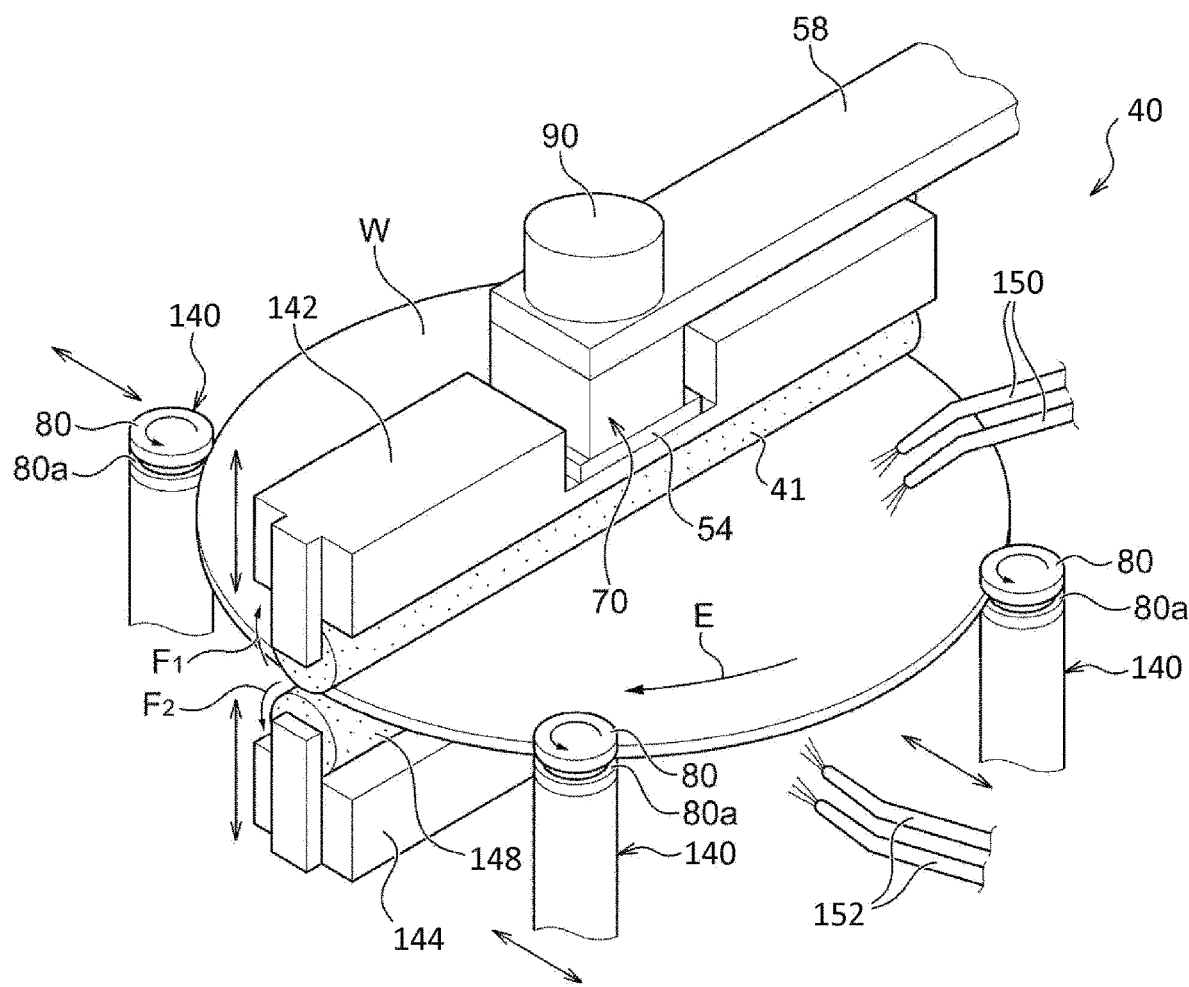
FIG. 1B is a perspective view showing an outline of the substrate cleaning apparatus according to one embodiment.

FIG. 1B is a perspective view showing an outline of the substrate cleaning apparatus 40 according to one embodiment. FIG. 2 is a side view showing a schematic configuration of an upper roll cleaning member in the substrate cleaning apparatus 40 according to one embodiment. FIG. 3 is an enlarged vertical cross-sectional view showing a region surrounded by an alternate long and short dash line denoted by reference numeral A in the substrate cleaning apparatus 40 shown in FIG. 2.

As shown in FIG. 1B, the substrate cleaning apparatus 40 includes a plurality of (four in the figure) spindles 140 for horizontally rotating the substrate W while supporting a peripheral edge portion of the substrate W such as a semiconductor wafer or the like with a front surface facing up. These spindles 140 are horizontally movable as indicated by arrows in FIG. 1B. In addition, the substrate cleaning apparatus 40 includes an upper roll arm 142 which is arranged above the substrate W in a manner of being raised and lowered freely and a lower roll arm 144 which is arranged below the substrate W in a manner of being raised and lowered freely.

The spindle 140 has a roller 80 arranged at an upper portion thereof. A fitting groove 80a is formed on an outer peripheral side surface of the roller 80. Besides, the peripheral edge portion of the substrate W is located in the fitting groove 80a, and the roller 80 is pressed against the substrate W and rotated. Thereby, the substrate W is rotated horizontally as indicated by an arrow E in FIG. 2. In the embodiment shown here, all four rollers 80 are connected to a drive mechanism (not shown) to apply a rotational force to the substrate W. It should be noted that two of the four rollers 80 may apply a rotational force to the substrate W (the drive mechanism is not shown), and the other two rollers 80 may function as bearings that receive the rotation of the substrate W.

An upper roll cleaning member (roll sponge) 41 which is columnar and extends horizontally is rotatably supported on the upper roll arm 142. The upper roll cleaning member 41 is configured by, for example, polyvinyl alcohol (PVA), and is rotated by a drive mechanism (not shown) as indicated by an arrow F1 in FIG. 1B. A lower roll cleaning member (roll sponge) 148 which is columnar and extends horizontally is rotatably supported on the lower roll arm 144. The lower roll cleaning member 148 is configured by, for example, PVA, and is rotated by a drive mechanism (not shown) as indicated by an arrow F2 in FIG. 1B.

Two upper supply nozzles 150 that supply chemicals and deionized water (rinse agents) to a front surface (an upper surface) of the substrate W are located above the substrate W which is supported and rotated by the spindle 140. One of the two upper supply nozzles 150 supplies chemicals and the other supplies deionized water. In addition, two lower supply nozzles 152 that supply chemicals and deionized water (rinse agents) to a back surface (a lower surface) of the substrate W are located below the substrate W which is supported and rotated by the spindle 40. One of the two lower supply nozzles 152 supplies chemicals and the other supplies deionized water. In addition, a liquid supply portion (not shown) supplies deionized water (inner rinse agent) to the inside of the upper roll cleaning member 41 and the inside of the lower roll cleaning member 148, respectively. The deionized water supplied to the inside of the upper roll cleaning member 41 and the inside of the lower roll cleaning member 148 is discharged from outer peripheral surfaces of the upper roll cleaning member 41 and the lower roll cleaning member 148.

The substrate W is cleaned as follows. In a state that the substrate W is rotated horizontally, a chemical is supplied from the upper supply nozzle 150 to the front surface (upper surface) of the substrate W, and the upper roll cleaning member 41 is rotated and lowered to be brought into contact with the front surface of the rotating substrate W with a predetermined pressing load. Thereby, the front surface of the substrate W is scrubbed and cleaned by the upper roll cleaning member 41 in the presence of the chemical. The length of the upper roll cleaning member 41 is set to be slightly longer than the diameter of the substrate W, and the entire front surface of the substrate W is cleaned at the same time.

At the same time as cleaning the front surface of the substrate W, a chemical is supplied from the lower supply nozzle 152 to the back surface (lower surface) of the substrate W, the lower roll cleaning member 148 is rotated and raised to be brought into contact with the back surface of the substrate W with a predetermined pressing load. Thereby, the back surface of the substrate W is scrubbed and cleaned by the lower roll cleaning member 148 in the presence of the chemical. The length of the lower roll cleaning member 148 is set to be slightly longer than the diameter of the substrate W, and the entire back surface of the substrate W is cleaned at the same time. After the front surface and the back surface of the substrate W are cleaned, deionized water is supplied from the upper supply nozzle 150 and the lower supply nozzle 152 to the front surface and the back surface of the substrate W, and deionized water is respectively supplied to the inside of the upper roll cleaning member 41 and the inside of the lower roll cleaning member 148, so that the substrate W, the upper roll cleaning member 41, and the lower roll cleaning member 148 are rinsed with the deionized water.

Next, a configuration of supplying deionized water (inner rinse agent) to the inside of the upper roll cleaning member 41 and the inside of the lower roll cleaning member 148 is described in detail. It should be noted that the configuration of the lower roll cleaning member 148 is the same as the configuration of the upper roll cleaning member 41, and hereinafter, the configuration of the upper roll cleaning member 41 (hereinafter, may be simply referred to as the cleaning member 41) is described in a representative manner.

Figure 2:
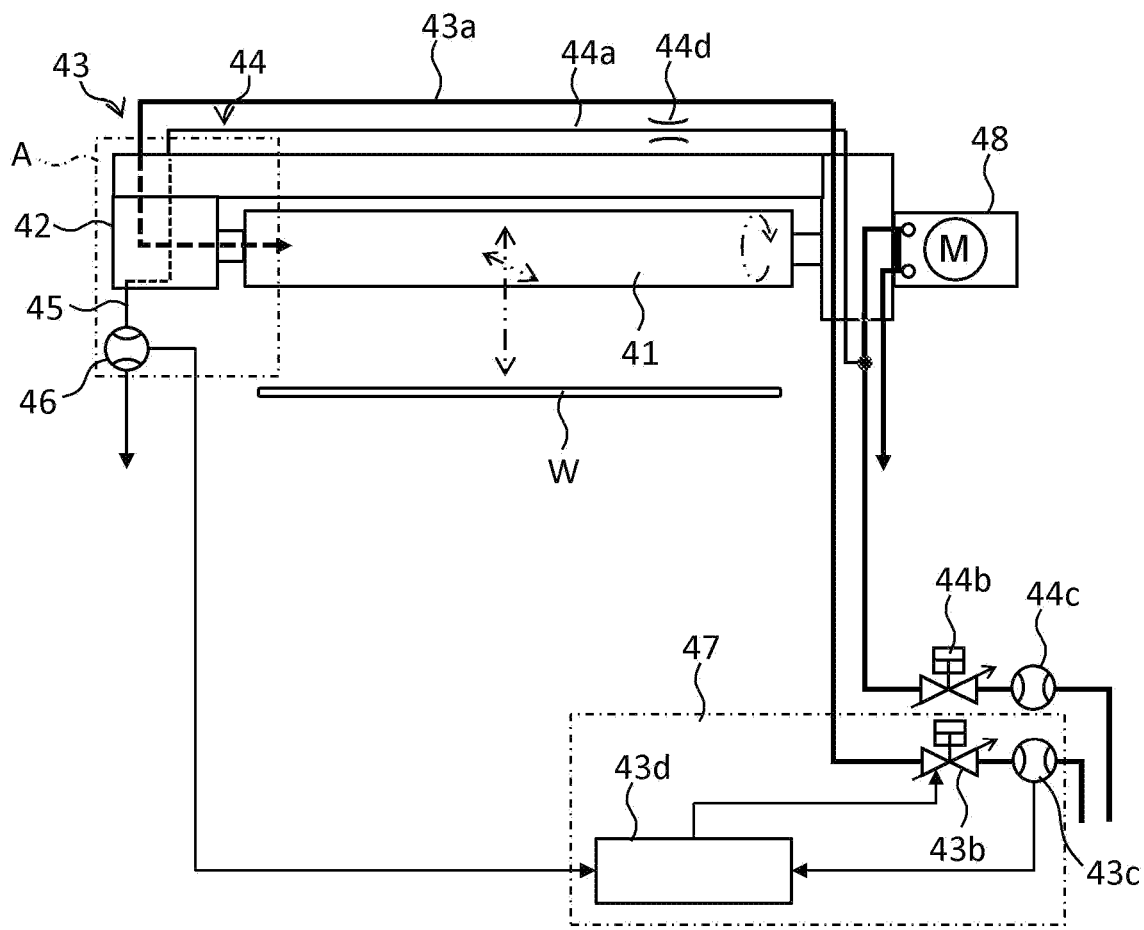
FIG. 2 is a side view showing a schematic configuration of an upper roll cleaning member in the substrate cleaning apparatus according to one embodiment.
Figure 3:
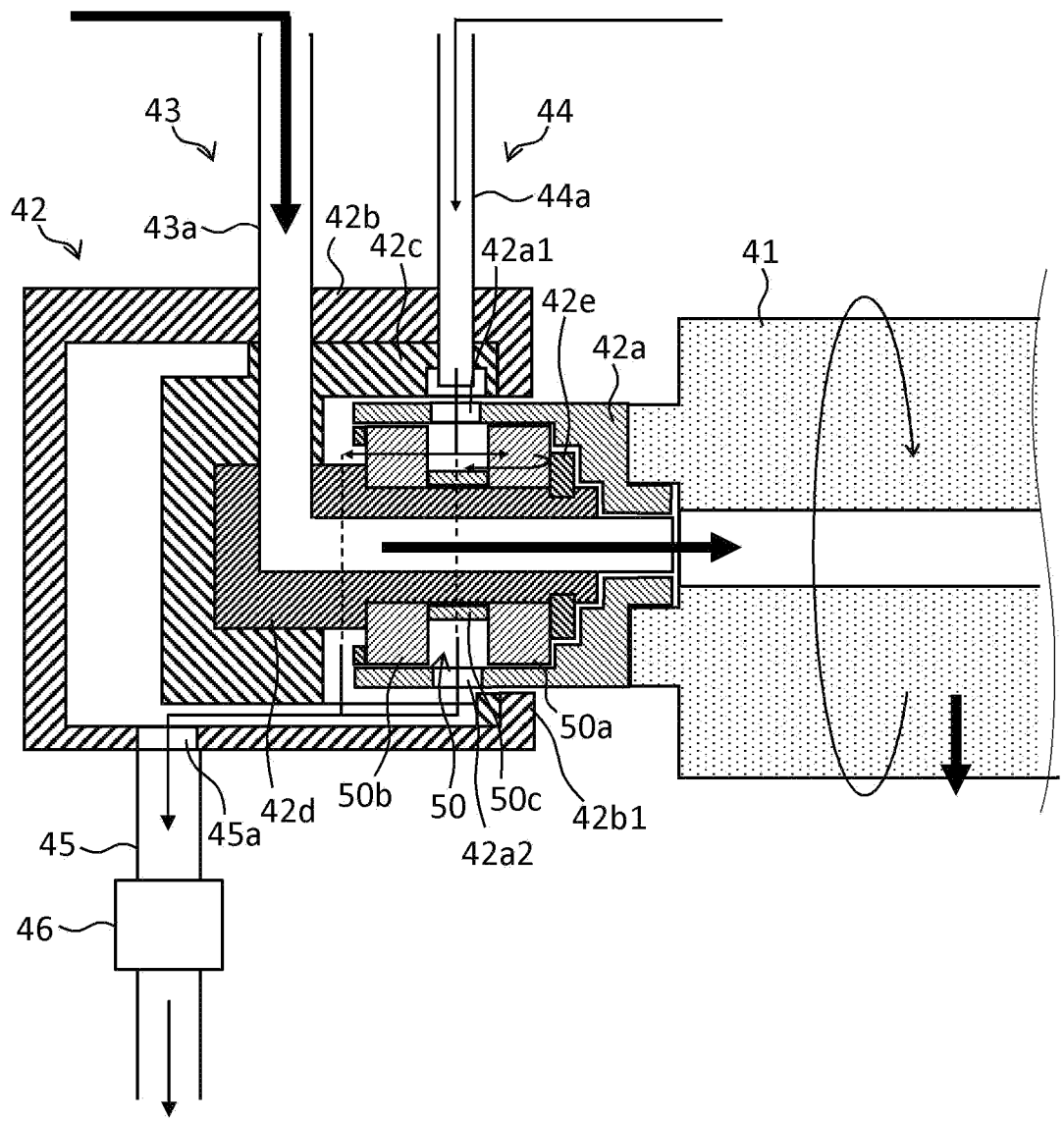
FIG. 3 is an enlarged vertical cross-sectional view showing a region surrounded by an alternate long and short dash line denoted by reference numeral A in the substrate cleaning apparatus shown in FIG. 2.

As shown in FIGS. 2 and 3, the substrate cleaning apparatus 40 includes a holding portion 42 having a bearing portion 50 that rotatably holds the cleaning member 41 for cleaning the substrate W, a first supply portion 43 that supplies a first liquid into the cleaning member 41, and a second supply portion 44 that supplies a second liquid to the bearing portion 50. The first liquid is typically an inner rinse agent and is, for example, deionized water. The second liquid is typically a bearing lubricating and cooling liquid used for lubricating and/or cooling a bearing and is, for example, deionized water. The first liquid and the second liquid may be the same liquid or different liquids. Moreover, a chemical can be used as the first liquid, and a chemical can also be used as the second liquid. Hereinafter, description is made using a roll cleaning member as the cleaning member 41, but the disclosure is not limited hereto. For example, the aspect of the embodiment can also be adopted for a brush-type scrub cleaning member, a pencil cleaning member, or a buff polishing and cleaning member.

As shown in FIGS. 2 and 3, by adopting the aspect having the first supply portion 43 that supplies the first liquid into the cleaning member 41 and the second supply portion 44 that supplies the second liquid to the bearing portion 50, the first liquid can be supplied in a constant amount and the bearing portion 50 can be lubricated and/or cooled by the second liquid. That is, as a comparative example, an aspect is considered in which the bearing portion 50 is lubricated using a liquid supplied to the substrate W without separating the first liquid and the second liquid, and in the aspect of this comparative example, the amount of the liquid supplied to the substrate W may fluctuate due to an influence in the amount of the liquid used to lubricate the bearing portion 50, but this embodiment can reduce such a possibility.

As shown in FIG. 2, one end of the cleaning member 41 made of a roll cleaning member may be held by the holding portion 42 in a driven manner, and the other end may be driven by a drive portion 48 having a motor. A liquid including DIW or the like for cooling the motor of the drive portion 48 may be used as the second liquid. In this case, it is advantageous in that there is no need to separately arrange a mechanism that supplies a liquid. The drive portion 48 may be arranged in a closed space isolated from a space for processing the substrate W and may be a space into which oil or the like is supplied. The bearing portion on the drive portion 48 side may be made of metal or the like.

As shown in FIG. 3, the bearing portion 50 on the driven side may have two or more (two in the illustrated example) bearing members 50a and 50b arranged in the axial direction. As the bearing members 50a and 50b, for example, ball bearings may be used. A collar 50c for arranging a gap may be arranged between the bearing members 50a and 50b in the axial direction. Due to the gap arranged by this collar, not only the contact between the bearing members 50a and 50b can be avoided more effectively, but a flow path can also be formed in the bearing portion 50, wherein the flow path is used for supplying the second liquid from a second supply pipe 44a described later to the bearing portion 50 through a hole 42a1 arranged in a direction in which the second supply pipe 44a is located, and smoothly discharging the second liquid from the bearing portion 50 through a hole 42a2 arranged on an opposite side of the hole 42a1 across the axial direction in the direction in which the second supply pipe is located.

The second supply portion 44 may have the second supply pipe 44a through which the second liquid flows, and supply the second liquid between the bearing members 50a and 50b in the axial direction. The second supply portion 44 can supply the second liquid between the bearing members 50a and 50b in the axial direction, and thereby supply the second liquid to each of the bearing members 50a and 50b located in two directions of the axial direction. In another embodiment, the second supply pipe 44a through which the second liquid flows may not be arranged at a position between the bearing members in the axial direction, but one second supply pipe 44a may be arranged at a position closer to the cleaning member than the position of the bearing member 50a and one second supply pipe 44a may be arranged at a position closer to the first supply portion 43 than the position of the bearing member 50b, and the second liquid may be supplied from each of the second supply pipes 44a to the bearing portion 50, that is, to each of the bearing members 50a and 50b. Furthermore, flow volume adjustment mechanisms described later can also be arranged separately and independently in the flow paths connected to the respective second supply pipes 44a, respectively. With this configuration, in one embodiment, for example, when the substrate is cleaned while being held vertically, the flow volume of the second liquid can be controlled for each of the bearing members 50a and 50b, and thus the liquid supply to the bearing members 50a and 50b can be controlled more appropriately. Note that, unless otherwise specified, the "axial direction" in the specification refers to an axial direction of the cleaning member 41, and refers to a left-right direction in FIGS. 2 and 3.

It should be noted that the number of the bearing members 50a and 50b is not limited to two or more, and may be one. In the case of one bearing member, the collar 50c may be omitted.

As shown in FIG. 3, the holding portion 42 may have a rotation body 42a rotating together with the cleaning member 41, an outer member 42c arranged on an outer periphery of the rotation body 42a, and an inner member 42d arranged integrally on the inner side of the outer member 42c. The cleaning member 41 and the rotation body 42a of the holding portion 42 are fixed to each other in order that a liquid does not leak, and the first liquid that overflows without being supplied to the cleaning member 41 may flow into the holding portion 42 from the fixed bearing portion and be drained to a drain side of the holding portion 42, via a slight gap between the rotation body 42a and the first supply portion 43, a slight gap between the rotation body 42a and the inner member 42d, and a slight gap between the rotation body 42a and the bearing members 50a and 50b.

Among these, an inner peripheral surface of the rotation body 42a may come into contact with an outer peripheral surface of the bearing portion 50. An end of the rotation body 42a may be inserted into the cleaning member 41 and fixed. An inner peripheral surface of the bearing portion 50 may come into contact with the inner member 42d, and the bearing portion 50 may support the rotation body 42a to be rotatable with respect to the inner member 42d. Regarding the gap between the inner member 42d and the rotation body 42a, it is sufficient if the second liquid supplied from the second supply pipe 44a does not flow into the cleaning member 41 from the gap between the inner member 42d and the rotation body 42a.

The first supply portion 43 may have a first supply pipe 43a for supplying the first liquid into the cleaning member 41. The first supply pipe 43a may be arranged so as to pass through the outer member 42c and the inner member 42d, and may extend into the rotation body 42a and reach an end of the cleaning member 41 without arranging a cut or the like between the bearing portion 50 and the rotation body 42a. In this case, the first liquid can be supplied to the cleaning member 41 without a reduction in the supply amount of the first liquid due to a cut or the like in the middle. As a result, a predetermined amount of the first liquid can be supplied to the substrate W, and substrate processing such as cleaning and the like of the substrate W can be performed with high precision.

As shown in FIG. 2, the first supply portion 43 may have a control portion 47 for controlling a supply flow volume of the first liquid. The control portion 47 may include a first adjustment valve 43b arranged in the first supply pipe 43a, a first flow meter 43c arranged on an upstream side of the first adjustment valve 43b, and a computer 43d that performs closed loop control (CLC) on a valve opening degree of the first adjustment valve 43b based on the flow volume of the first liquid measured by the first flow meter 43c. As the first flow meter 43c, for example, a Karman vortex type flow meter, an ultrasonic flow meter, or the like may be used.

Similarly, the second supply portion 44 may have a second adjustment valve 44b arranged in the second supply pipe 44a and a second flow meter 44c arranged on an upstream side of the second adjustment valve 44b, and the computer 43d described above may perform closed loop control (CLC) on a valve opening degree of the second adjustment valve 44b based on the flow volume of the second liquid measured by the second flow meter 44c. As the second flow meter 44c, for example, a Karman vortex type flow meter, an ultrasonic flow meter, or the like may be used.

As shown in FIG. 2, the second supply portion 44 may have an orifice 44d for adjusting the flow volume. Adjustment performed by the orifice 44d may be changed according to a rotation speed of the cleaning member 41. The supply amount of the second liquid may increase as the rotation speed of the cleaning member 41 increases, and the supply amount of the second liquid in the case of a first rotation speed may be larger than the supply amount of the second liquid in the case of a second rotation speed (the first rotation speed>the second rotation speed). In addition, a supply amount Q of the second liquid=A×a rotation speed R of the cleaning member 41+B ("A" and "B" are predetermined constants), and the supply amount Q of the second liquid and the rotation speed R of the cleaning member 41 may have a linear function relationship. If the supply amount of the second liquid is too large, a risk of flowing into the cleaning member 41 increases, and there is a waste of merely increasing a consumption flow volume, and thus the supply amount of the second liquid may be, for example, 10 to 50 mm/min.

The first liquid and the second liquid may be supplied at the same timing, or may be supplied at different timings. For example, an aspect may also be adopted in which the second supply portion 44 supplies the second liquid to the bearing portion 50 even when the first supply portion 43 does not supply the first liquid into the cleaning member 41. In this case, whereas the second liquid is continuously supplied to cool and/or wet the bearing portion 50, for example, the first liquid can be supplied only when processing on the substrate W of when cleaning substrate and the like is performed and/or only when the cleaning member 41 is cleaned, so that the substrate W and/or the cleaning member 41 can be efficiently cleaned and the bearing portion 50 can be efficiently cooled and wetted. It should be noted that this control may be performed by a control portion such as the control apparatus 30 (see FIG. 1).

As shown in FIG. 3, the rotation body 42a may rotate together with the cleaning member 41, and may be equipped with one or more holes 42a1 and 42a2 for supplying the second liquid to the bearing portion 50. In this case, by rotating the rotation body 42a, the second liquid can be supplied to the bearing portion 50 via the holes 42a1 and 42a2. Only one of the holes 42a1 and 42a2 may be arranged, or a plurality of the holes 42a1 and 42a2 may be arranged. When a plurality of holes 42a1 and 42a2 are arranged, the holes 42a1 and 42a2 may be arranged at equal intervals. In this case, the second liquid can be evenly supplied to the bearing portion 50, and the bearing portion 50 can be efficiently lubricated and/or cooled. The number of the holes 42a1 and 42a2 is, for example, 8 to 16, and is typically 12. The diameters of the holes 42a1 and 42a2 are about 3 mm. If the number of the holes 42a1 and 42a2 is large, the second liquid can be provided to the bearing portion 50 at a short interval, but if the number of the holes 42a1 and 42a2 is too large, the strength of the rotation body 42a is weakened. From these points of view, it is beneficial that the number of the holes 42a1 and 42a2 is 8 to 16. All of the holes 42a1 and 42a2 may be located between the bearing members 50a and 50b in the axial direction. The sizes of the holes 42a1 and 42a2 may be set corresponding to the gap between the bearing members 50a and 50b. Here, the fact that the sizes of the holes 42a1 and 42a2 correspond to the gap between the bearing members 50a and 50b means that diameters R of the holes 42a1 and 42a2 are 90% or more and 100% or less of a gap D between the bearing members 50a and 50b, and means that $D \times 0.9 \leq R \leq D$. The sizes of the respective holes 42a1 and 42a2 may be all the same or different as long as they are within this numerical range. By arranging the holes 42a1 and 42a2 between the bearing members 50a and 50b in the axial direction, it is possible to prevent the liquid falling from the holes 42a1 and 42a2 from splashing due to the rotating bearing members 50a and 50b and leaking to the substrate W side. That is, when the holes 42a1 and 42a2 are arranged at positions overlapping the bearing members 50a and 50b in the axial direction, the second liquid that has fallen on the bearing members 50a and 50b may splash due to the rotating bearing members 50a and 50b and leak to the substrate W side, but this aspect can reduce such a possibility.

As shown in FIG. 3, a sealed portion 42e may be arranged around a part or all of an outer periphery of the inner member 42d surrounding the first supply pipe 43a for supplying the first liquid, so that the gap between the rotating member denoted by reference numeral 50a and the inner member 42d is not exposed to the cleaning member 41. The sealed portion 42e may be arranged to face the bearing portion 50. No member may be arranged between the sealed portion 42e and the bearing portion 50.

As shown in FIG. 3, a lower portion of the outer member 42c may be open without covering the hole 42a1 of the rotation body 42a. In this case, pressure can be prevented from being applied to the second liquid, and the second liquid can be smoothly guided to a discharge port 45a.

A case 42b may be arranged outside the outer member 42c. A space may be arranged between the case 42b and the outer member 42c, and a lower gap between the case 42b and the outer member 42c may be larger than an upper gap between the case 42b and the outer member 42c. In this case, pressure applied to the second liquid makes it easier to guide the second liquid downward, the second liquid can be prevented from flowing to unexpected locations, and eventually the second liquid can be prevented from leaking from the holding portion 42 to the substrate W. The case 42b may be equipped with a fixing portion (not shown) such as a fixing rod for fixing the outer member 42c. An elastic member (not shown) such as a spring may be arranged between the case 42b and the outer member 42c, and the rotation body 42a, the outer member 42c, and the inner member 42d may be movable in the axial direction with respect to the case 42b when the cleaning member 41 is attached to the holding portion 42.

A weir 42b1 may be arranged on the substrate W side of the case 42b, and the weir 42b1 may be arranged so as to face a surface of the outer member 42c on the cleaning member 41 side (a surface on the right side in FIG. 3). In this case, the weir 42b1 can prevent the second liquid from accidentally leaking to the substrate W side.

A double weir may be arranged at a lower portion of the case 42b separately from the weir 42b1, or an inclined portion may be further arranged at the lower portion of the case 42b, to further prevent the second liquid from flowing to the cleaning member side (the right side in FIG. 3).

As shown in FIG. 3, the holding portion 42 may be equipped with a discharge portion 45 including a discharge pipe or the like which has the discharge port 45a for discharging the liquid accumulated inside the holding portion 42. The discharge port 45a may be arranged on a bottom surface of the case 42b.

As shown in FIGS. 2 and 3, the discharge portion 45 may be equipped with a flow meter 46 that measures a flow volume of the liquid discharged from the discharge port 45a. The flow meter 46 may be capable of measuring a flow volume of less than 100 mL, and an impeller type flow meter or the like may be used therefor.

Figure 4:
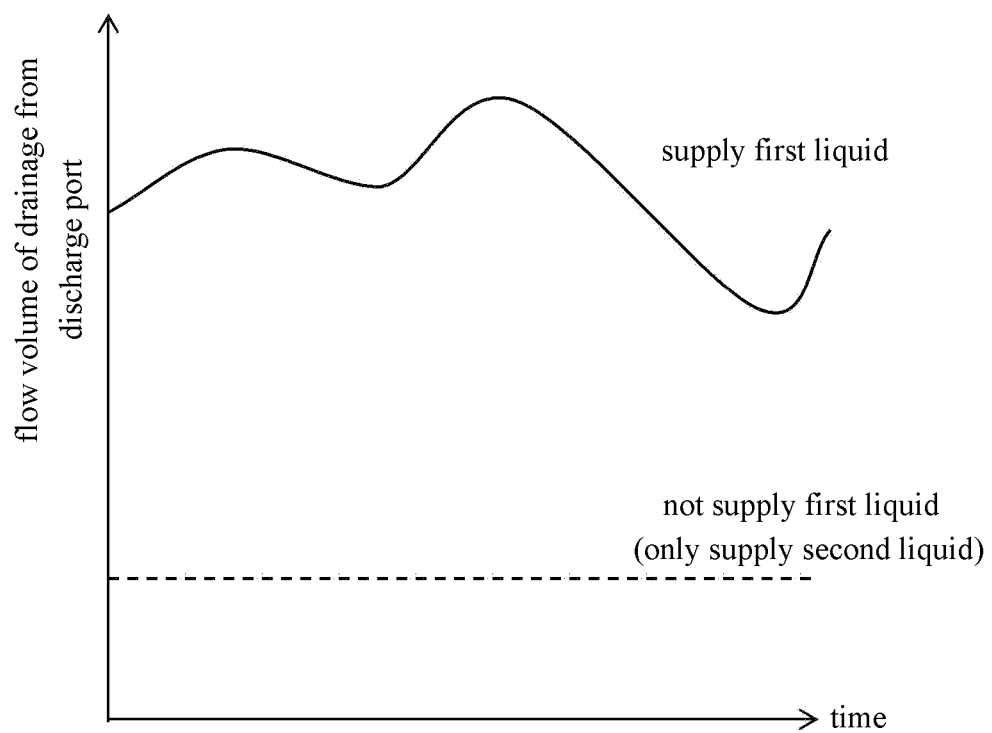
FIG. 4 is a graph showing a time change of a flow volume of a drainage from a discharge port.

FIG. 4 is a graph showing a time change of the flow volume of the drainage from the discharge port 45a. In FIG. 4, the solid line shows the flow volume of the drainage discharged from the discharge port 45a when both the first liquid and the second liquid are supplied, and the broken line shows the flow volume of the drainage discharged from the discharge port 45a when the first liquid is not supplied and only the second liquid is supplied. As shown in FIG. 4, when only the second liquid is supplied for cooling and/or wetting the bearing portion 50, the flow volume of the drainage is constant because only the second liquid is discharged from the discharge port 45a (see the broken line). On the contrary, when both the first liquid and the second liquid are supplied for processing on the substrate W such as substrate cleaning and the like, the flow volume of the drainage increases and fluctuates compared with the case in which only the second liquid is supplied (see the solid line).

As a result of the diligent studies by the inventors on the reason why the flow volume of drainage increases and fluctuates, the following findings are obtained. That is, as described above, the flow volume of the first liquid supplied into the cleaning member 41 is controlled to be constant by the closed loop control (CLC) performed by the control portion 47. However, there is a case in which depending on individual differences, changes over time and the like in the drainage performance of the cleaning member 41, the first liquid supplied at a constant flow volume is not all discharged through the cleaning member 41, but flows from the gap between the rotation body 42a and the inner member 42d onto the discharge port 45a side through the bearing portion 50 and is drained. Therefore, conventionally, it has been difficult to supply the first liquid into the cleaning member 41 at a constant flow volume all the time.

On the other hand, there is a risk that when control is performed to reduce the supply flow volume of the first liquid in order to reduce the drainage amount of the first liquid to zero, the first liquid is not supplied into the cleaning member 41 in the originally required amount.

On the contrary, in the embodiment, with reference to FIG. 2, the control portion 47 may control the supply flow volume of the first liquid by further considering the flow volume of the drainage measured by the flow meter 46. Specifically, for example, the computer 43d of the control portion 47 may perform the closed loop control (CLC) on the valve opening degree of the first adjustment valve 43b based on both the supply flow volume of the first liquid measured by the first flow meter 43c and the flow volume of the drainage measured by the flow meter 46 of the discharge portion 45.

As an example, the control portion 47 may increase the supply flow volume of the first liquid from the first supply portion 43 when the flow volume of the drainage from the discharge port 45a increases. For example, when the first liquid is supplied from the first supply portion at a constant flow volume, as the amount of the first liquid flowing from the bearing portion 50 onto the discharge port 45a side and drained increases gradually due to the individual differences, the changes over time, and the like in the drainage performance of the cleaning member 41, the amount of the first liquid actually supplied into the cleaning member 41 and supplied to the substrate W through the cleaning member 41 decreases gradually, and substrate processing such as cleaning and the like of the substrate W cannot be performed with high precision. On the contrary, the control portion 47 can increase the supply flow volume of the first liquid from the first supply portion 43 when the flow volume of the drainage from the discharge port 45a increases, and thereby increase the amount of the first liquid actually supplied into the cleaning member 41 and supplied to the substrate W through the cleaning member 41. Thus, the fluctuation in the amount of the first liquid supplied to the substrate W through the cleaning member 41 can be reduced, and the substrate processing such as cleaning and the like of the substrate W can be performed with high precision. Moreover, the control portion 47 may determine that "the flow volume of the drainage has increased" when the drainage amount exceeds an unacceptable threshold value and increase the supply flow volume of the first liquid, or may determine that "the flow volume of the drainage has increased" when "an increasing tendency (inclination) of the drainage amount is detected" (that is, the case in which a slope value (differential value) of a curve when the liquid amount of the drainage amount is plotted over time exceeds a threshold value is determined to be on an increasing tendency) within a flow volume range equal to or less than an acceptable limit value and increase the supply flow volume of the first liquid.

In still another embodiment, after "the increasing tendency (inclination) of the drainage amount is detected" (that is, determination is made on whether the slope value (differential value) of the curve when the liquid amount of the drainage amount is plotted over time exceeds the threshold value), detection is further made on whether the amount of the drainage exceeds a predetermined threshold value, and it may be determined that "the flow volume of the drainage has increased" only when both the conditions are met and the supply flow volume of the first liquid may be increased. In this way, it is possible to prevent erroneous determination by using the two determination steps to detect whether "the flow volume of the drainage has increased".

As another example, the control portion 47 may reduce the supply flow volume of the first liquid from the first supply portion 43 when the flow volume of the drainage from the discharge port 45a increases. By reducing the supply flow volume of the first liquid from the first supply portion 43, the amount of the first liquid that is not discharged to the substrate W side through the cleaning member 41 but flows from the bearing portion 50 onto the discharge port 45a side and is drained (the wasted flow volume) decreases, and thus the wasted flow volume can be reduced and the environmental load can be reduced. Moreover, the control portion 47 may determine that "the flow volume of the drainage has increased" when the amount of the drainage exceeds an unacceptable threshold and reduce the supply flow volume of the first liquid, or may determine that "the flow volume of the drainage has increased" when "an increasing tendency (inclination) of the drainage amount is detected" (that is, the case in which a slope value (differential value) of a curve when the liquid amount of the drainage amount is plotted over time exceeds a threshold value is determined to be on an increasing tendency) within a flow volume range equal to or less than an acceptable limit value and reduce the supply flow volume of the first liquid.

In still another embodiment, after "the increasing tendency (inclination) of the drainage amount is detected" (that is, determination is made on whether the slope value (differential value) of the curve when the liquid amount of the drainage amount is plotted over time exceeds the threshold value), detection is further made on whether the amount of the drainage exceeds a predetermined threshold value, and it may be determined that "the flow volume of the drainage has increased" only when both the conditions are met and the supply flow volume of the first liquid may be reduced. In this way, it is possible to prevent erroneous determination by using the two determination steps to detect whether "the flow volume of the drainage has increased".

The control portion 47 may estimate a flow volume S3 of the first liquid supplied into the cleaning member 41 by subtracting a flow volume D of the drainage from the discharge port 45a from the sum of a supply flow volume S1 of the first liquid by the first adjustment valve 43b and a supply flow volume S2 of the second liquid by the orifice 44d (that is, may calculate S3 by a formula S3=S1+S2−D). Thereby, the flow volume of the first liquid actually supplied into the cleaning member 41 can be estimated.

The control portion 47 specifies at least one of a timing of self-cleaning of the cleaning member 41, a timing of replacement of the cleaning member 41, and a completion timing of break-in based on the estimated flow volume of the first liquid (the flow volume of the first liquid actually supplied into the cleaning member 41).

According to the embodiment as described above, in the aspect having the first supply portion 43 that supplies the first liquid into the cleaning member 41 and the second supply portion 44 that supplies the second liquid to the bearing portion 50, even if there is a case in which the first liquid supplied at a constant flow volume is not all discharged through the cleaning member 41, but flows from the bearing portion 50 onto the discharge port 45a side and is drained depending on the individual differences, the changes over time, and the like in the drainage performance of the cleaning member 41, because the flow meter 46 arranged in the discharge portion 45 measures the flow volume of the liquid discharged from the discharge port 45a, for example, by subtracting the supply flow volume S2 of the second liquid from the flow volume D of the drainage measured by the flow meter 46, a flow volume E of the first liquid supplied from the first supply portion 43 that is not discharged through the cleaning member 41 can be calculated (E=S2−D), or by subtracting the flow volume D of the drainage measured by the flow meter 46 from the sum of the supply flow volume S1 of the first liquid and the supply flow volume S2 of the second liquid, the flow volume S3 of the first liquid actually supplied into the cleaning member 41 can be calculated (S3=S1+S2−D). Thus, with respect to the flow volume of the first liquid supplied from the first supply portion 43, the flow volume of the first liquid actually supplied into the cleaning member 41 (the flow volume of the first liquid discharged through the cleaning member 41) and the flow volume of the first liquid that is not discharged through the cleaning member 41 (wasted flow volume, which is not used in cleaning processing) are known, and thus it is possible to optimize the flow volume of the first liquid supplied from the first supply portion 43 into the cleaning member 41 according to requests of each user or process, such as a request to supply the first liquid into the cleaning member 41 at a constant flow volume, a request to reduce the wasted flow volume and reduce an environmental load, and other requests.

In addition, according to the embodiment, the control portion 47 controls the supply flow volume of the first liquid based on the flow volume of the drainage measured by the flow meter 46, and thus the supply flow volume of the first liquid can be optimized more appropriately compared with the case in which the supply flow volume of the first liquid is controlled not based on the flow volume of the drainage measured by the flow meter 46.

Note that, in the above-described embodiment, as shown in FIGS. 2 and 3, the cleaning member 41 is arranged in a manner of extending in the horizontal direction, but the disclosure is not limited hereto, and the cleaning member 41 may be arranged in a manner of extending in the vertical direction, or may be arranged in a manner of extending in an oblique direction between the horizontal direction and the vertical direction.

In addition, in the example shown in FIG. 2, one cleaning member 41 is arranged above the substrate W, but the disclosure is not limited hereto. A plurality of cleaning members 41 may be arranged, and each cleaning member 41 may be equipped with the holding portion 42, the discharging portion 45, and the flow meter 46. For example, as shown in FIG. 1B, the aspect may be adopted in which the cleaning members 41 and 148 are arranged on both the upper side and the lower side of the substrate W (both the front surface and the back surface of the substrate W), and the holding portion 42, the discharge portion 45, and the flow meter 46 are arranged for each of the cleaning members 41 and 148.

Although the embodiments of the disclosure have been described above by way of illustration, the scope of the disclosure is not limited hereto, and can be changed or modified according to an object within the scope described in the claims. For example, in one embodiment, the substrate after wet processing in which trenches having a high aspect ratio are present on the substrate surface can also be cleaned using the substrate cleaning apparatus disclosed above. In addition, for example, the disclosure can also be applied to a substrate cleaning apparatus that cleans a substrate while holding the substrate vertically. In addition, each embodiment and variation example can be appropriately combined as long as the processing contents do not contradict each other.

What is claimed is:

1. A substrate cleaning apparatus, comprising:
   a holding portion having a bearing portion that rotatably holds a cleaning member for cleaning a substrate;
   a first supply portion that is at least partially arranged inside the holding portion and supplies a first liquid into the cleaning member through the inside of the holding portion;
   a second supply portion that supplies a second liquid to the bearing portion; and
   a second flow meter, measuring a supply flow volume of the second liquid that is supplied from the second supply portion;
   wherein the holding portion is equipped with a discharge portion that has a discharge port for discharging liquid accumulated inside the holding portion as drainage, the liquid accumulated inside the holding portion including the first liquid that overflows without being supplied to the cleaning member and the second liquid, and the discharge portion is equipped with a flow meter that measures a flow volume of the liquid discharged from the discharge port.

2. The substrate cleaning apparatus according to claim 1, wherein the first supply portion has a control portion, comprising a first adjustment valve, for controlling a supply flow volume of the first liquid, and when the flow volume of the drainage measured by the flow meter that measures a flow volume of the liquid discharged from the discharge port changes with respect to the supply flow volume of the first liquid and the supply flow volume of the second liquid, the control portion controls the supply flow volume of the first liquid based on the amount of this change.

3. The substrate cleaning apparatus according to claim 2, wherein the control portion increases the supply flow volume of the first liquid when the flow volume of the drainage increases.

4. The substrate cleaning apparatus according to claim 2, wherein the control portion reduces the supply flow volume of the first liquid when the flow volume of the drainage increases.

5. The substrate cleaning apparatus according to claim 2, wherein the control portion estimates the flow volume of the first liquid supplied into the cleaning member by subtracting the flow volume of the drainage from the sum of the supply flow volume of the first liquid and the supply flow volume of the second liquid.

6. The substrate cleaning apparatus according to claim 5, wherein the control portion specifies at least one of a timing of self-cleaning of the cleaning member, a timing of replacement of the cleaning member, and a completion timing of break-in based on the estimated flow volume of the first liquid.

7. The substrate cleaning apparatus according to claim 1, wherein the bearing portion includes two bearing members arranged side by side in an axial direction, and the second supply portion supplies the second liquid between the two bearing members in the axial direction.

8. The substrate cleaning apparatus according to claim 1, wherein the second supply portion supplies the second liquid to the bearing portion even when the first supply portion does not supply the first liquid into the cleaning member.

9. The substrate cleaning apparatus according to claim 1, wherein the holding portion has a rotation portion that rotates together with the cleaning member and is equipped with one or more holes for supplying the second liquid to the bearing portion.

10. A substrate cleaning apparatus, comprising:
a holding portion having a bearing portion that rotatably holds a cleaning member for cleaning a substrate;
a first supply portion that is at least partially arranged inside the holding portion and supplies a first liquid into the cleaning member through the inside of the holding portion; and
a second supply portion that supplies a second liquid to the bearing portion;
wherein the holding portion is equipped with a discharge port for discharging liquid from the inside of the holding portion as drainage, and
the substrate cleaning apparatus comprises a control portion, comprising a first adjustment valve, that controls a supply flow volume of the first liquid based on a drainage amount signal from a flow meter of the drainage discharged from the discharge port.

11. The substrate cleaning apparatus according to claim 10, wherein the bearing portion includes two bearing members arranged side by side in an axial direction, and the second supply portion supplies the second liquid between the two bearing members in the axial direction.

12. The substrate cleaning apparatus according to claim 10, wherein the second supply portion supplies the second liquid to the bearing portion even when the first supply portion does not supply the first liquid into the cleaning member.

13. The substrate cleaning apparatus according to claim 10, wherein the holding portion has a rotation portion that rotates together with the cleaning member and is equipped with one or more holes for supplying the second liquid to the bearing portion.

14. A substrate processing apparatus, comprising:
a substrate polishing apparatus that polishes a substrate; and
a substrate cleaning apparatus that cleans the substrate after polishing;
wherein the substrate cleaning apparatus comprises:
a holding portion having a bearing portion that rotatably holds a cleaning member for cleaning the substrate;
a first supply portion that is at least partially arranged inside the holding portion and supplies a first liquid into the cleaning member through the inside of the holding portion; and
a second supply portion that supplies a second liquid to the bearing portion;
a second flow meter, measuring a supply flow volume of the second liquid that is supplied from the second supply portion;
the holding portion is equipped with a discharge portion that has a discharge port for discharging liquid accumulated inside the holding portion, the liquid accumulated inside the holding portion including the first liquid that overflows without being supplied to the cleaning member and the second liquid, and
the discharge portion is equipped with a flow meter that measures a flow volume of the liquid discharged from the discharge port.

15. A substrate processing apparatus, comprising:
a substrate polishing apparatus that polishes a substrate; and
a substrate cleaning apparatus that cleans the substrate after polishing;
wherein the substrate cleaning apparatus comprises:
a holding portion having a bearing portion that rotatably holds a cleaning member for cleaning the substrate;
a first supply portion that is at least partially arranged inside the holding portion and supplies a first liquid into the cleaning member through the inside of the holding portion; and
a second supply portion that supplies a second liquid to the bearing portion;
the holding portion is equipped with a discharge portion that has a discharge port for discharging liquid from the inside of the holding portion as drainage, and
the substrate cleaning apparatus comprises a control portion, comprising a first adjustment valve, that controls a supply flow volume of the first liquid based on a drainage amount signal from a flow meter of the drainage discharged from the discharge port.

* * * * *